United States Patent
Kisakibaru et al.

[11] Patent Number: 5,945,008
[45] Date of Patent: *Aug. 31, 1999

[54] METHOD AND APPARATUS FOR PLASMA CONTROL

[75] Inventors: Toshiro Kisakibaru, Kanagawa; Akira Kojima, Oita; Yasushi Kato, Kanagawa; Isao Honbori, Kanagawa; Satoshi Bannai, Kanagawa; Tomohiro Chiba, Kanagawa; Toshitaka Kawashima, Kanagawa, all of Japan

[73] Assignee: Sony Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/534,042

[22] Filed: Sep. 26, 1995

[30] Foreign Application Priority Data

Sep. 29, 1994 [JP] Japan .................................. 6-234815

[51] Int. Cl.$^6$ ........................................................ H05H 1/00
[52] U.S. Cl. ............................ 216/71; 427/569; 427/571; 438/729; 438/732; 204/192.31; 204/192.32; 204/298.37; 204/298.16; 156/345; 118/723 E
[58] Field of Search ........................... 156/345; 118/723 I, 118/723 E; 204/298.16, 298.2, 298.37, 192.31, 192.32; 216/71; 427/569, 571; 438/729, 732

[56] References Cited

U.S. PATENT DOCUMENTS

| 4,740,268 | 4/1988 | Bukhman | 156/345 X |
| 5,431,769 | 7/1995 | Kisakibaru et al. | 156/345 |
| 5,444,207 | 8/1995 | Sekine et al. | 156/345 X |
| 5,534,108 | 7/1996 | Quian et al. | 156/643.1 |

Primary Examiner—Thi Dang
Attorney, Agent, or Firm—Hill & Simpson

[57] ABSTRACT

The present invention provides a method for plasma control, in which an electric field is generated in the direction perpendicular to the surface of an object to be processed in plasma atmosphere generated in a processing chamber and another electric field is generated in the direction parallel to the surface, and the direction of ion or electron in plasma atmosphere is controlled by controlling the composite electric field composed of both the electric fields. The invention provides also an apparatus for plasma control provided with a perpendicular electric field generating means for generating an electric field in the direction perpendicular to the surface of the object, and a parallel electric field generating means for generating an electric field in the direction parallel to the surface of the object.

2 Claims, 12 Drawing Sheets

F I G. 13A
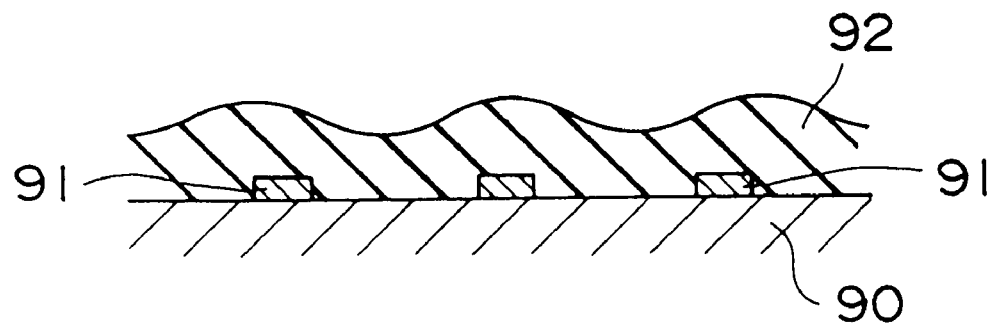
F I G. 13B
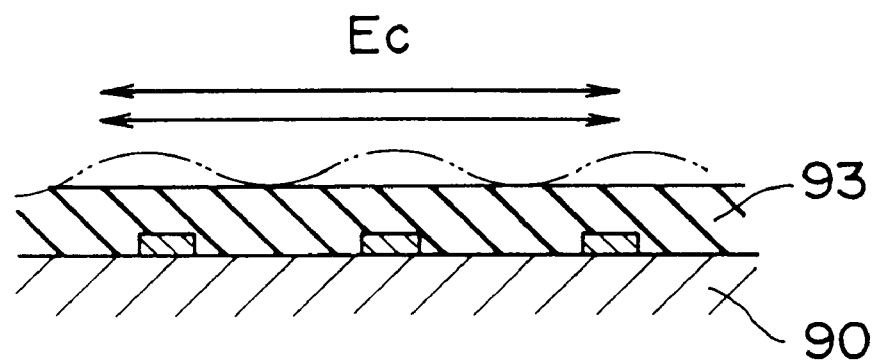

1

METHOD AND APPARATUS FOR PLASMA CONTROL

BACKGROUND OF THE INVENTION

1. Field of the Invention

The present invention relates to a method for plasma control and an apparatus for plasma control used in plasma CVD, plasma RIE, and sputtering.

2. Description of the Related Art

Plasma processing is categorized to various technologies such as plasma CVD, plasma RIE, sputtering and ion plating, but any way in the all these technologies an object to be processed is placed in a processing chamber and a type of plasma is generated, thus the object is subjected to film forming or etching by the action of ion or electron.

FIGS. 1A and 1B are schematic diagrams for illustrating conventional plasma processing equipments, FIG. 1A shows a parallel flat plate type, and FIG. 1B shows ECR type equipments.

The parallel flat plate type equipment comprises a processing chamber 1 in which the object 4 to be processed such as wafer is placed, top and bottom electrodes 5 and 6 provided facing each other in the processing chamber 1, and a DC bias 2 and high frequency bias 3 for applying voltage on the bottom electrode 6.

For processing using the parallel flat plate type plasma processing equipment, a gas (not shown) is introduced in the processing chamber 1, and high frequency bias 3 of, for example, 13.56 MHz is applied to generate plasma 7 in a space between the top electrode 5 and the bottom electrode 6, and thus, for example, a film is formed on the surface of the object 4.

Plasma 7 in the processing chamber 1 is controlled by electric field perpendicular to the surface of the object 4 and flow of the gas to maintain the plasma density uniform.

The ECR type plasma processing equipment shown in FIG. 1B comprises a processing chamber 11 in which the object 10 to be processed is placed, a wave guide 11a for feeding microwave into the processing chamber 11, and coils 12 for generating magnetic field.

For operating the ECR type plasma processing equipment, a gas is introduced into the processing chamber 11 and microwave with a frequency of, for example, 2.45 GHz is fed to cause discharging, and the rotation of electrons which are being rotated by applying magnetic field from the boils 12 resonates with the frequency of microwave to generates high performance plasma 13.

The plasma 13 in the processing chamber 1 is controlled by prescribed bias and gas flow to process the object 10.

In any plasma processing equipment for proper processing, ion or electron is controlled to be projected perpendicular to the surface of the object.

Therefore, the quality of processing in the direction perpendicular to the surface of the object, for example, film thickness and etching depth, can be controlled, but the quality in the direction other than perpendicular direction cannot be controlled, and these equipments are not suitable for processing of the object with complex structure.

For example, when a taper is to be provided at a trench and a oxide film with desired thickness is to be formed on the inside surface of the trench on a semiconductor element, a conventional plasma processing equipment cannot control such processing, this disadvantage of the conventional equipment has been a serious problem for processing objects with complex structure.

SUMMARY OF THE INVENTION

It is the first object of the present invention to control the movement of ion or electron in plasma using electric field and magnetic field.

It is the second object of the present invention to provide semiconductor devices processed with ion or electron in plasma under controlled condition.

The present invention provides a method for plasma control for controlling ion or electron in plasma atmosphere in a processing chamber in which the object to be processed is placed, electric fields are generated in the directions not only perpendicular to the surface of the object but also parallel to the surface of the object, and the direction of ion or electron in plasma is controlled based on the composite electric field.

The present invention provides a method for plasma control as described in the above mentioned inventions, in which the electric field in the parallel direction to the surface of the object is generated by inverting the direction of magnetic field generated in the parallel direction to the surface periodically.

The present invention provides a method for plasma control for controlling the direction of ion or electron in plasma atmosphere generated in a processing chamber in which the object to be processed is placed, in which electric field is generated in the perpendicular direction to the surface of the object and another electric field generated in the direction parallel to the surface of the object is rotated by rotating a magnetic field which is generated in the direction parallel to the surface around an axis perpendicular to the surface to control ion or electron in the plasma atmosphere based on the composite electric field composed of both directions.

The present invention provides a method for plasma control as described in the above mentioned inventions, in which ion or electron in plasma atmosphere is controlled by adjusting gas pressure introduced in the processing chamber.

The present invention provides a method for plasma control as described in the above mentioned inventions, in which the electric field generated in the direction parallel to the surface of the object in the processing chamber is controlled based on reactance and conductivity of the electrode on which the object is to be placed in the processing chamber.

The present invention provides a method for plasma control as described in the above mentioned inventions, in which the magnetic flux density around the surface of the object is controlled based on the moving period of the magnetic field generated in the direction parallel to the surface of the object.

The present invention provides a method for plasma control in accordance with the above mentioned inventions, in which the invention is applied when plasma is used for plasma CVD, plasma is used for plasma RIE, plasma is used for sputtering, and plasma is used for ion-plating.

The present invention provides a method for plasma control as described in the above mentioned invention, wherein the invention is applied when plasma is used for flattening of the object and plasma is used for polishing of the object.

The present invention provides an apparatus for plasma control for controlling ion or electron in plasma atmosphere generated in a processing chamber in which the object to be processed is placed, provided with a perpendicular electric field generating means for generating an electric field in the direction perpendicular to the surface of the object and a parallel electric field generating means for generating an electric field in the direction parallel to the surface of the object.

The present invention provides an apparatus for plasma control as described in the above mentioned invention, in which the parallel electric field generating means comprises a pair of coils provided facing each other outside the processing chamber with interposition of the object and an power supply means for feeding an AC current with a certain period to the pair of coils.

The present invention provides an apparatus for plasma control for controlling ion or electron in plasma atmosphere generated in a processing chamber in which the object to be processed is placed, provided with a perpendicular electric field generating means for generating an electric field in the direction perpendicular to the surface of the object and a rotating magnetic field generating means for rotating a magnetic field generated in the direction parallel to the surface of the object.

The present invention provides an apparatus for plasma control as described in the above mentioned invention, in which the rotating magnetic field generating means comprises a coil wound around the object and a polyphase power supply for feeding a current to the coil.

The present invention provides an apparatus for plasma control, in which the rotating magnetic field generating means comprises a ring shaped permanent magnet for generating a magnetic field in the direction parallel to the surface of the object provided around the object and a rotating mechanism for rotating the permanent magnet around the object.

The present invention provides an apparatus for plasma control in accordance the above mentioned inventions, in which a magnetic ring is provided around the electrode on which the object is to be placed in the processing chamber and around the object.

The present invention provides an apparatus for plasma control which is applied to plasma CVD apparatus, plasma RIE apparatus, sputtering apparatus, and ion-plating apparatus.

The present invention provides an apparatus for plasma control which is applied to a flattening apparatus for flattening processing of the object with plasma and a polishing apparatus for polishing processing of the object with plasma.

In the method for plasma control in accordance with the present invention, an electric field in the direction perpendicular to the surface of the object is generated and also another electric field in the direction parallel to the surface is generated, and the composite electric field composed of the perpendicular electric field and parallel electric field provides a force to ion or electron to move in desired direction, thus the direction of ion or electron is controlled.

In the method for plasma control in accordance with the present invention, a magnetic field is generated in the direction parallel to the surface of the object and the direction of the magnetic field is inverted to generate an induced electric field around the magnetic field.

The induced electric field generated as described above is utilized as an electric field parallel to the surface of the object.

In the method for plasma control in accordance with present invention, the magnetic field generated in the direction parallel to the surface of the object is rotated around an axis perpendicular to the surface.

The rotation of the magnetic field generates an induced electric field around the magnetic field, and the induced electric field rotates along the surface of the object.

The moving direction of ion or electron in plasma atmosphere is controlled by the resultant force of the rotating induced electric field and the electric field in the direction perpendicular to the surface of the object.

In addition, by controlling gas pressure introduced into the processing chamber to control the force provided to ion or electron, the moving direction and moving speed of ion or electron are controlled.

By controlling the electric field generated in the direction parallel to the surface of the object based on reactance and conductivity of the electrode on which the object is to be placed in the processing chamber and by controlling magnetic flux density around the surface of the object based on the moving period of the magnetic field generated in the direction parallel to the surface of the object, magnetic flux which passes the electrode are excluded outside, and the effect on magnetic flux around the surface of the object is mitigated.

In the apparatus for plasma control in accordance with the present invention, the electric field in the direction perpendicular to the surface of the object is generated with a perpendicular electric field generating means and the other electric field in the direction parallel to the surface of the object is generated with a parallel electric field generating means.

The composite electric field composed of both the directions thereby controls the moving direction of ion or electron in plasma atmosphere.

By rotating a magnetic field generated in the direction parallel to the surface of the object using a rotating magnetic field generating means, an induced electric field is generated surrounding the magnetic field.

The induced electric field rotates along the surface of the object with the rotation of the magnetic field, and the composite electric field composed of the induced electric field and the electric field in the perpendicular direction provides a force to ion or electron in plasma atmosphere to control the moving direction of ion or electron.

By providing a magnetic ring around the electrode on which the object is to be placed in the processing chamber and around the object, the passing of magnetic flux through the object is prevented to suppress the circuit damage.

BRIEF DESCRIPTION OF THE DRAWINGS

FIG. 1A is a parallel plate type, and FIG. 1B is an ECR type.

FIG. 5A shows the plasma side, and FIG. 5B shows the bottom electrode side.

FIG. 10A is a perspective view, FIG. 10B is a cross sectional view, and FIG. 10C is a diagram for illustrating the flow of magnetic flux.

FIGS. 13A and 13B are sectional views for illustrating an example of flattening processing of the eighth embodiment in accordance with the present invention.

DETAILED DESCRIPTION OF THE PREFERRED EMBODIMENTS

Figure 1A:
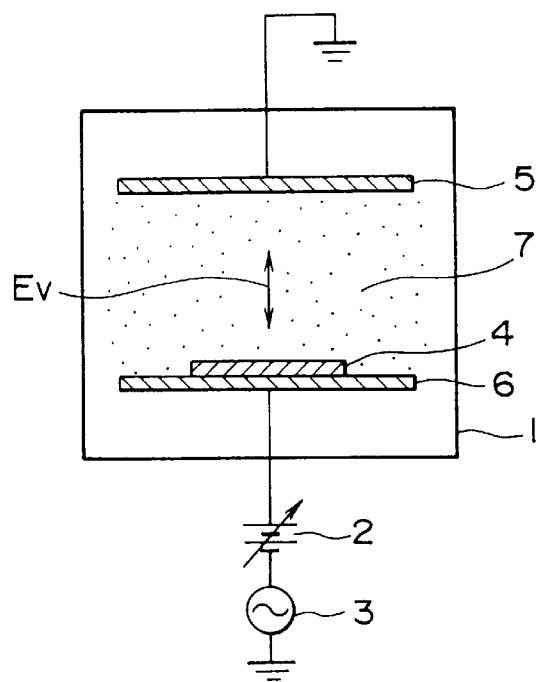
FIGS. 1A and 1B are schematic diagrams of an apparatus for plasma control in accordance with related art.
Figure 1B:
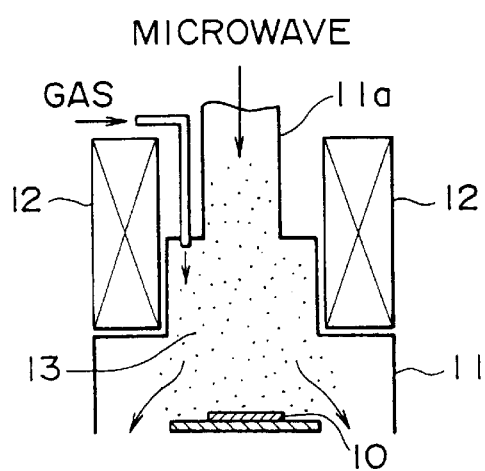

Embodiments of the method for plasma control and the apparatus for plasma control in accordance with the present invention will be described hereinafter in detail referring to the drawings.

Figure 2:
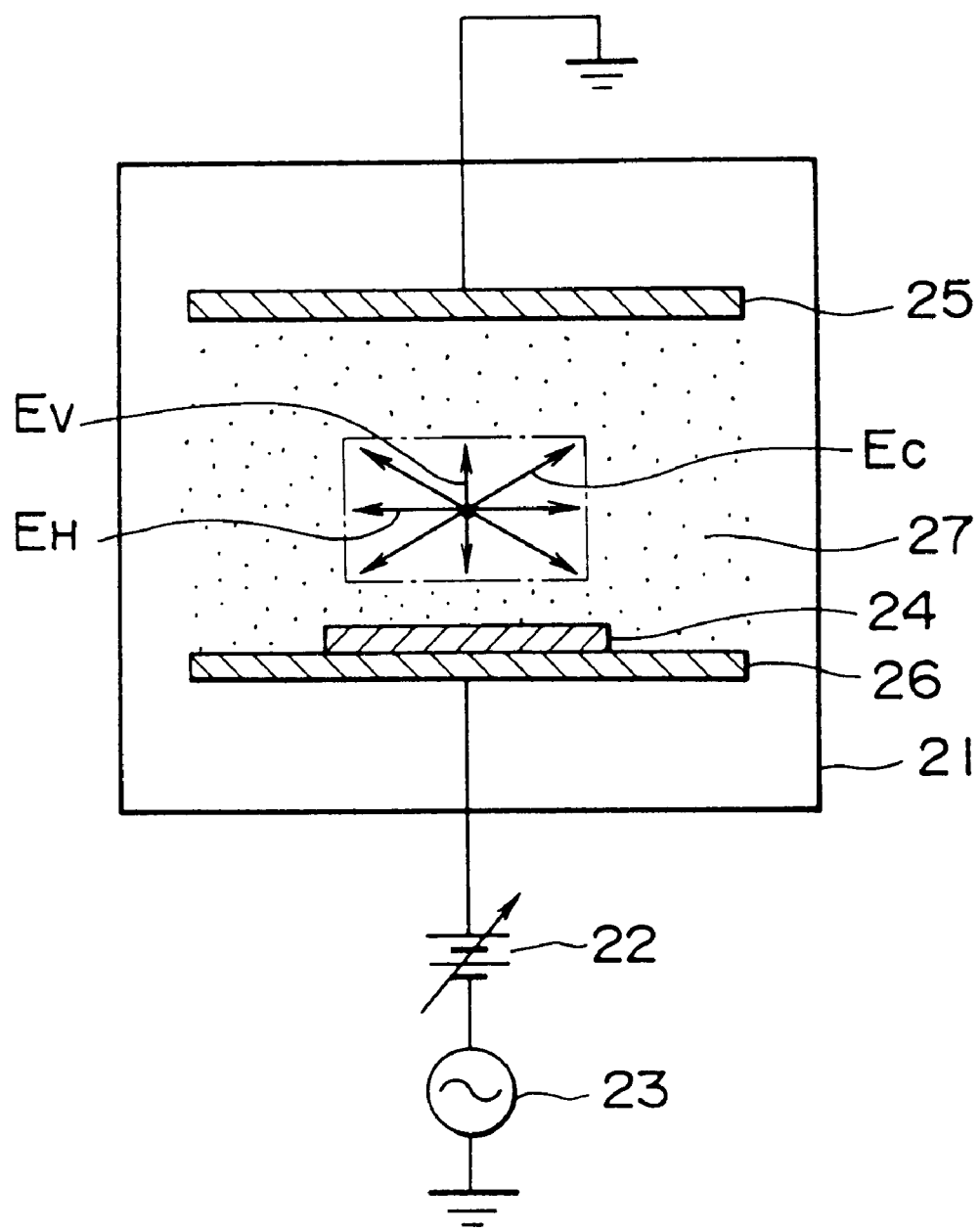
FIG. 2 is a schematic diagram for illustrating the outline of a method for plasma control of the first embodiment in accordance with the present invention.

FIG. 2 is a schematic diagram for illustrating a method for plasma control of the first embodiment in accordance with the present invention showing an example of a parallel plate type apparatus for plasma control.

The method for plasma control is a method for controlling the moving direction of ion or electron in plasma atmosphere 27 generated in a space between the top electrode 25 and the bottom electrode 26 provided in a processing chamber 21.

The moving direction of ion or electron in plasma atmosphere 27 is controlled by controlling the direction of composite electric field Ec composed of a perpendicular electric field Ev in the direction perpendicular to the surface of the object 24 such as a wafer and a parallel electric field $E_H$ generated in the parallel direction in the processing chamber 21.

The electric field Ev in the direction perpendicular to the surface of the object 24 comprises a plasma sheath electric field generated inevitably on the surface of the object 24, a DC bias electric field generated by DC bias 22 applied on the bottom electrode 26, and a high frequency bias electric field generated by a high frequency bias 23 with, for example, frequency of 13.56 MHz.

The electric field $E_H$ in the direction parallel to the surface of the object 24 comprises an induced electric field obtained by movement of a magnetic field in the direction parallel to the surface of the object 24 as described hereinafter.

In the present invention, the moving direction of ion or electron in plasma atmosphere 27 is controlled by using the resultant composite electric field Ec which is obtained by combining the electric field Ev perpendicular to the surface of the object 24 and the parallel electric field $E_H$, that is by controlling the ratio of $EV/E_H$ properly.

The response of $CF_4^+$, which is used for plasma etching, to the electric field frequency is described.

The force (F) which is exerted on a $CF_4^+$ ion in an electric field is determined by the product of a charge (q) and electric field strength (E) as represented by the equation (1). Also, the force (F) exerted on a $CF_4^+$ ion is the product of the molecular weight of $CF_4^+$ ion (M) and acceleration ($\alpha$).

$$F=qE=M\alpha \tag{1}$$

From the equation (1), the moved distance (L) of an $CF_4^+$ ion at time t is represented by the equation (2).

$$L=(\tfrac{1}{2})\alpha t^2=(\tfrac{1}{2})(qE/M)t^2 \tag{2}$$

From the equation (2), the moved distance Lv of a $CF_4^+$ ion in the perpendicular electric field is represented by the equation (3).

$$Lv=(\tfrac{1}{2})(qEv/M)t^2 \tag{3}$$

Accordingly, for example, under a condition of 13.56 MHz (a half period time $t=0.5\times13.56\times10^{-6}$ (Sec)), and an electric field strength $Ev=2\times10^3$ V/m, the moved distance (Lv) of $CF_4^+$ ion in a perpendicular electric field is calculated to be $1.49\times10^{-6}$ m.

Herein for easy understanding of the calculation, for perpendicular bias electric field, the sum of the plasma sheath electric field and DC bias electric field is zero, and only high frequency bias electric field is taken into the calculation.

Similarly based on the equation (2), the moved distance $L_H$ of a $CF_4^+$ ion in a parallel electric field is represented by the equation (4).

$$L_H=(\tfrac{1}{2})(qE_H/M)t^2 \tag{4}$$

Accordingly, for example, under a condition of 800 Hz (a half period time $t=0.5\times800\times10^{-2}$ (sec)), and an electric field strength $E_H=1.5\times102$ V/m, the moved distance $L_H$ of the $CF_4^+$ ion is calculated to be $3.21\times101$ m.

It is understandable from the calculations that under the high frequency electric field condition such as 13.56 MHz a $CF_4^+$ ion moves only the distance of microns, but under the low frequency electric field condition such as 800 Hz for the parallel electric field the $CF_4^+$ ion moves the distance of meters.

The reason is that the mass of the ion is larger than the mass of an electron and the difference in the mass causes the more delayed response under the higher frequency condition.

Based on the above mentioned principle, for example, by providing parallel electric field $E_H$ with variable strength and frequency in addition to a high frequency perpendicular electric field Ev with a frequency of 13.56 MHz, a composite electric field Ec in a desired direction in the range from perpendicular to parallel to the surface of the object 24 is generated.

According to the present invention, the composite electric field Ec is applied to control the moving direction of ion or electron in plasma atmosphere 27, and thus the composite electric field Ec allows ion or electron to be directed in the desired direction to the surface of the object 24.

Then, a method for generating an electric field $E_H$ parallel to the surface of object 24 is described herein under.

FIG. 3 is a schematic diagram for illustrating a method for inducing a parallel electric field by utilizing inverting magnetic field.

Figure 3A:
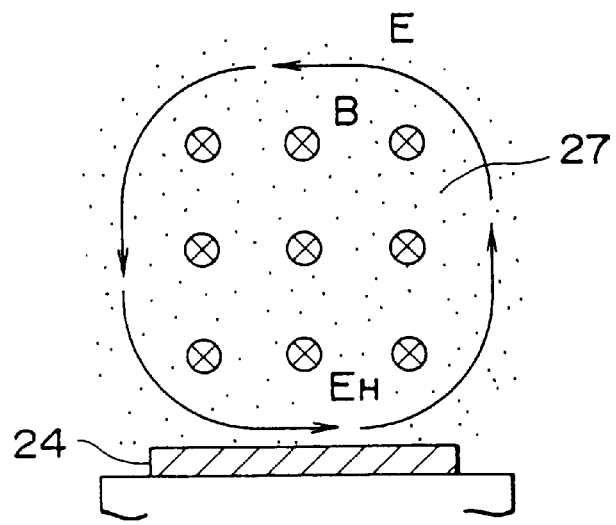
FIGS. 3A and 3B are schematic diagrams for illustrating a method for inducing a parallel electric field by inverting magnetic field.
Figure 3B:
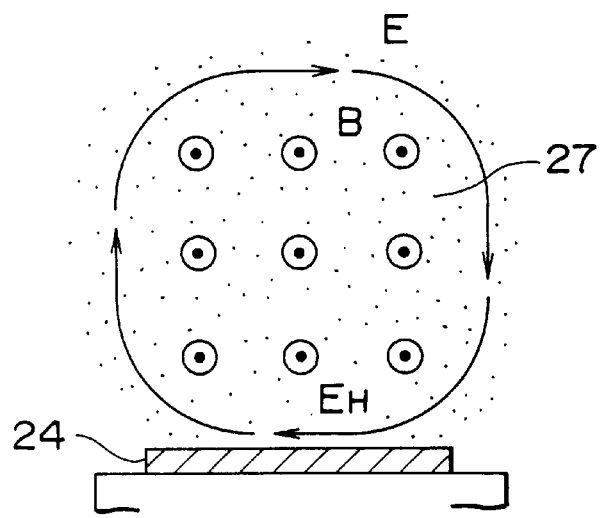

In this method, a magnetic field with a magnetic flux density B is generated in the direction parallel to the surface of the object 24 in plasma atmosphere 27, and the direction is inverted periodically as shown in FIG. 3A and FIG. 3B to generate an induced electric field E around the magnetic field in the direction surrounding the magnetic field.

By inverting induced electric field E, the parallel electric field $E_H$ on the surface of the object 24 is inverted periodically in the direction right to left and left to right in the figure.

Therefore, the direction of composite electric field Ec (refer to FIG. 2) composed of the electric field $E_H$ and the perpendicular electric field Ev (refer to FIG. 2) is inverted with a certain angle, and thus the direction of ion or electron in plasma atmosphere 27 is controlled.

Figure 4A:
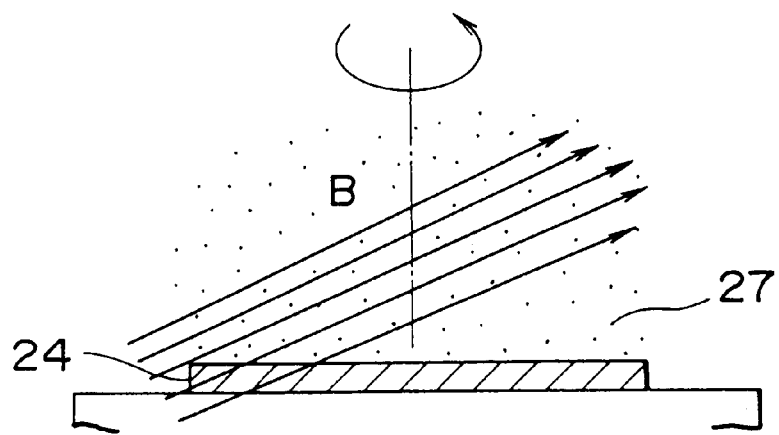
FIGS. 4A and 4B are schematic diagrams for illustrating a method for inducing parallel electric field by rotating magnetic field.
Figure 4B:
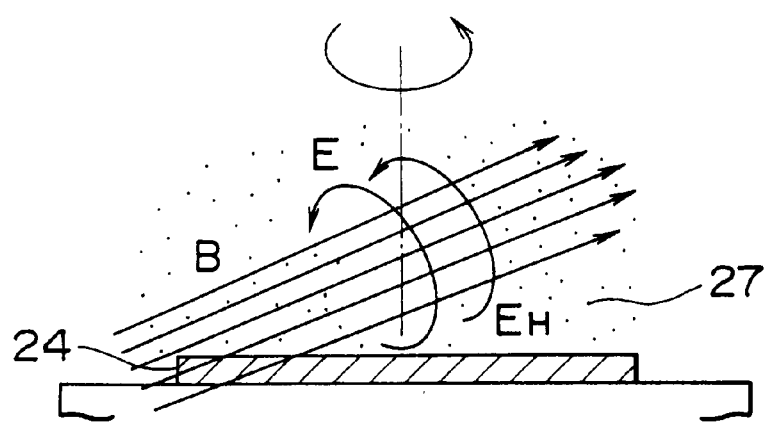

FIGS. 4A and 4B are schematic diagrams for illustrating a method for inducing a parallel electric field by utilizing rotating magnetic field.

In this method, a magnetic field with a magnetic flux density of B is generated in the direction parallel to the surface of the object 24 in plasma atmosphere 27 (refer to FIG. 4A), the magnetic field is rotated around an axis perpendicular to the surface of the object 24.

By rotation of the parallel magnetic field, a band induced electric field E is generated in the direction surrounding the magnetic field, and the band induced electric field E rotates along the surface of the object 24 with the rotation of the magnetic field.

On the surface of the object 24, the parallel electric field $E_H$ rotates with the rotation of the magnetic field, a composite electric field Ec (refer to FIG. 2) composed of the parallel electric field $E_H$ and the perpendicular electric field Ev (refer to FIG. 2) rotates with a certain angle to the surface of the object 24.

Then, a method for plasma control for controlling a parallel electric field $E_H$ uniformly and in parallel on the surface of the object 24.

As described hereinbefore, in the present invention, the direction of ion or electron in plasma atmosphere 28 is controlled by a composite electric field Ec composed of a parallel electric field $E_H$ and perpendicular electric field Ev on the surface of the object 24.

The passing of the magnetic field for generating the parallel electric field $E_H$ through the bottom electrode 26 on which the object 24 is to be placed causes the induction of an electric field on the bottom electrode side 26. The induced electric field induces a current, and the current induces a magnetic field.

Therefore, the magnetic field on the surface of the object 24 is a composite magnetic field composed of a magnetic field on the plasma side 27 and a magnetic field on the bottom electrode side 26.

Figure 5A:
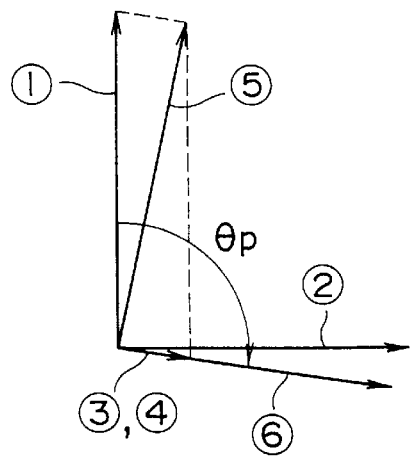
FIGS. 5A and 5B show the relationship between magnetic field and electric field.
Figure 5B:
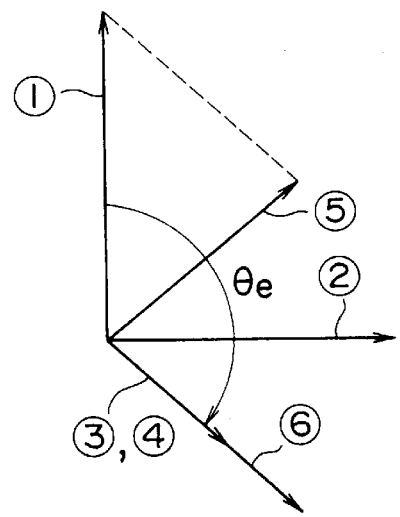

FIGS. 5A and 5B show the relationship between magnetic field and electric field on the plasma side and the bottom electrode side.

In FIG. 5, the arrow ① represents an initially applied magnetic field, the arrow ② represents an induced electric field, the arrow ③ represents an induced current, the arrow ④ represents an induced magnetic field, the arrow ⑤ represents a final magnetic field, and the arrow ⑥ represents the strength and direction of the final induced electric field.

As shown in the figure, an induced electric field represented by the arrow ② is generated in the direction perpendicular to the initially applied magnetic field represented by the arrow ①. The induced current generated due to the induced electric field generates a phase difference due to reactance as shown with the arrow ③.

On the plasma side shown in FIG. 5A, a phase angle lag of the induced current, the arrow ③, from the arrow ① of angle θp is generated, and on the bottom electrode side shown in FIG. 5B, a phase angle lag of the induced current, the arrow ③, from the arrow ① of angle θe is generated.

The angle θe is far larger than the angle θp, depending on the difference, the direction and strength of the induced magnetic field represented by the arrow ④ and final magnetic field represented by the arrow ⑤ are varied respectively. The induced current represented by the arrow ③ on the bottom electrode side is larger than that on the plasma side because the conductivity of the bottom electrode side is larger than that of the plasma side.

Therefore, the direction and strength of the final induced electric field represented by the arrow ⑥ of the plasma side is different from that of the bottom electrode side.

In the present invention, by utilizing the difference in the direction and strength of the final induced electric field represented by the arrow ⑥ between the plasma side and the bottom electrode side, the direction and strength of the final induced electric field on the plasma side and the bottom electrode side is controlled based on reactance and conductivity of the bottom electrode 26, and thus the electric field $E_H$ in direction parallel to the surface of the object 24, which is a composite electric field composed of these induced electric fields, is controlled.

For example, the use of material for the bottom electrode 26 with a higher conductivity results in the larger phase lag of the induced current represented by the arrow ③ shown in FIG. 5B, the effect on the final induced electric field on the plasma side represented by the arrow ⑥ in FIG. 5A is reduced to control the electric field $E_H$ in parallel and uniform.

In addition, by optimization of reactance and conductivity of the bottom electrode 26, the electric field $E_H$ (refer to FIG. 2) in the direction parallel to the surface of the object 24 is controlled in parallel and uniform to control properly the composite electrode Ec.

Figure 6A:
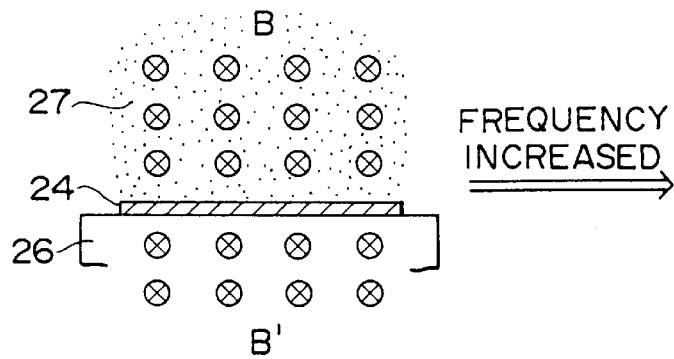
FIGS. 6A and 6B are schematic diagrams for illustrating the relationship between frequency and magnetic flux.
Figure 6B:
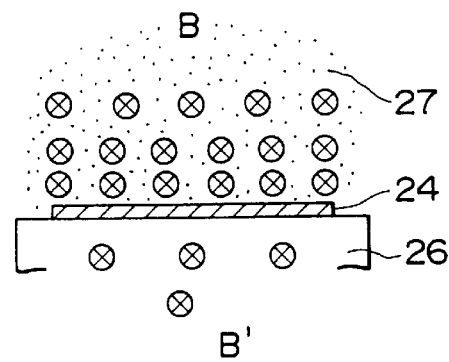

Then, a method for plasma control utilizing the relationship between magnetic flux density and the magnetic field change with time (frequency) generated in plasma atmosphere 27 is described hereinunder with reference to FIGS. 6A and 6B.

FIG. 6 is a diagram for describing the relationship between magnetic flux density and magnetic field change with time in plasma atmosphere 27.

As described hereinbefore, in the present invention, a magnetic field with a magnetic flux density B is generated in plasma atmosphere 27, and the magnetic field is subjected to a change (inversion and rotation) to generates an electric field $E_H$ in the direction parallel to the surface of the object 24, and thus the direction of ion or electron in plasma atmosphere 27 is controlled.

On the other hand, also on the bottom electrode side 26 a magnetic field with a magnetic flux density B' is generated, thus on the surface of the object 24 a composite electric field composed of the electric field on the bottom electrode side 27 and the electric field on plasma side 27 determines the parallel electric field $E_H$.

In the present invention, by controlling the change with time (frequency) of the magnetic field generated in plasma atmosphere 27, the magnetic flux density generated on the bottom electrode side 26 and magnetic flux density around the surface of the object 24 are controlled to control the parallel electric field $E_H$.

For example, the larger time change of the magnetic field generated in plasma atmosphere 27 results in more reduced magnetic flux which passes through the bottom electrode 26 as shown in FIG. 6B. The magnetic flux is excluded to the vicinity of the surface of the object 24, and magnetic flux density near the surface becomes high (skin effect).

The higher magnetic flux density near the surface of the object 24 results in the more reduced electric field generated on the bottom electrode side 26 and the more parallel, uniform, and strengthened electric field on plasma side 27, namely electric field $E_H$ generated in the direction parallel to the surface of the object 24.

In short, by controlling the time change of magnetic field in plasma atmosphere 27, the electric field $E_H$ in the direction parallel to the surface of the object 24 is controlled in parallel and uniformly and strengthened to control properly the composite electric field Ec.

In the present invention, plasma controlled by the method for plasma control described hereinbefore is used for plasma treatment processes such as plasma CVD, plasma RIE, sputtering, and ion plating.

Thereby, the direction of ion or electron in plasma atmosphere 27, that is, the direction of the processing such as film formation and etching is controlled.

In the present invention the plasma is used for also flattening and polishing of objects 24.

In this case, by generating a composite electric field Ec in the direction parallel to the surface of the object 24, the flattening and polishing are made possible.

In the method for plasma control in accordance with the present invention, the direction of ion or electron in plasma atmosphere 27 may be controlled by controlling gas pressure introduced into the processing chamber 21 (refer to FIG. 2).

For example, in the case which gas is introduced in the direction perpendicular to the surface of the object 24, by increasing the pressure the speed of ion or electron in plasma atmosphere 27 in the perpendicular direction, namely energy, can be increased, thus the moving direction and moving speed of ion or electron is controlled by controlling the gas pressure.

Then, an apparatus for plasma control of the second embodiment in accordance with the present invention for practical application of the method for parallel electric field induction is described herein under.

Figure 7:
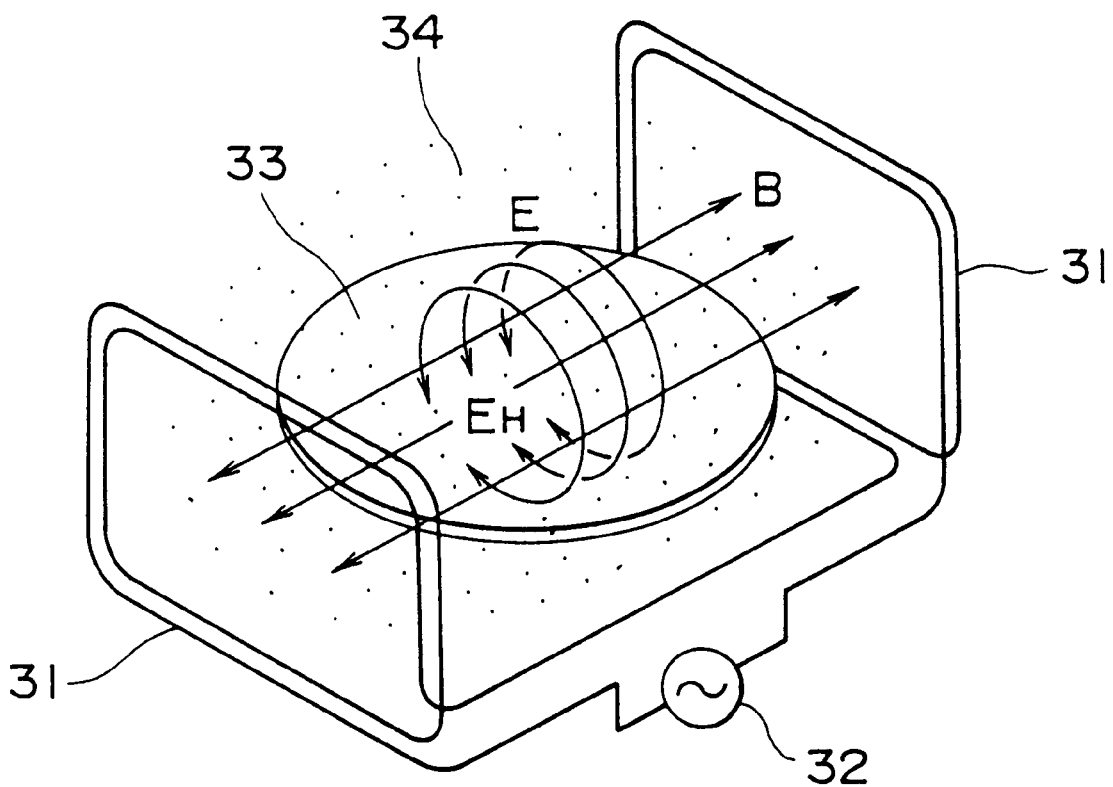
FIG. 7 is a perspective view for illustrating an apparatus for plasma control utilizing inverting magnetic field of the second embodiment in accordance with the present invention.

FIG. 7 is a schematic diagram for illustrating an apparatus for plasma control for practical application of the method for parallel electric field induction utilizing inverting magnetic field.

The apparatus for plasma control comprises a pair of coils 31 provided facing each other with interposition of the object 33 and a single phase AC power supply 32 for feeding an AC current with a certain period to the coils 31.

The pair of coils 31 is provided, for example, outside the processing chamber 21 (refer to FIG. 2), the coils are fed with an AC current with a frequency in a range from several 10 Hz to several kHz to generate a magnetic field with a magnetic flux density B in the direction parallel to the surface of the object 33.

By changing the current fed to the coils 31, the magnetic field in the direction parallel to the surface of the object 33 is inverted periodically, the inversion of the magnetic field causes the generation of an induced electric field E in the direction surrounding the magnetic field.

The direction of the induced electric field E is inverted corresponding to the period of current, and also the direction of parallel electric field $E_H$ is inverted periodically.

In this apparatus for plasma control, the parallel electric field $E_H$ which is being inverted directionally and the perpendicular electric field Ev (refer to FIG. 2) by the high frequency bias 23 (refer to FIG. 2) are generated, and the composite electric field Ec thereof (refer to FIG. 2) controls the moving direction of ion or electron in plasma atmosphere 27.

Thereby, the film forming and etching processing in a desired direction on the object 33 is made possible.

FIGS. 8A, 8B, 9A, and 9B are schematic diagrams for illustrating an apparatus for plasma control of the third and fourth embodiments in accordance with the present invention for practical application of the parallel electric field induction method utilizing rotating magnetic field.

Figure 8A:
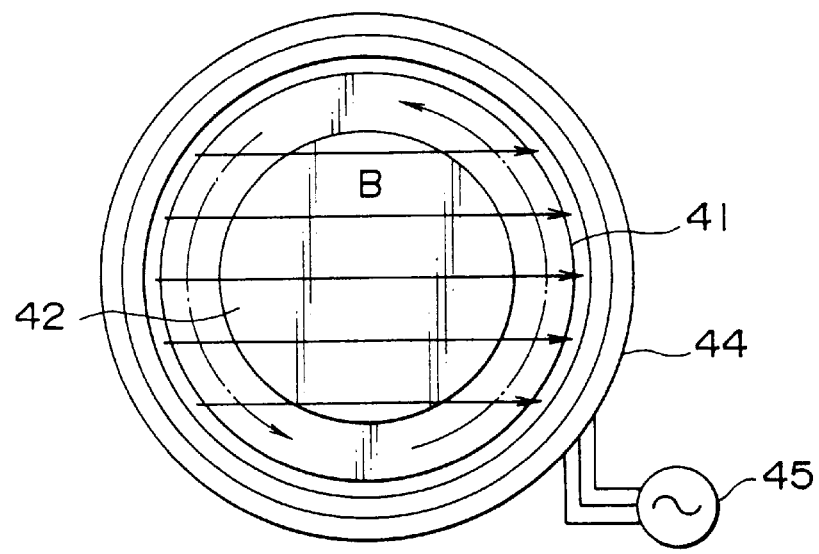
FIGS. 8A and 8B show the third embodiment in accordance with the present invention, and is a diagram for illustrating an apparatus for plasma control utilizing rotating magnetic field.
Figure 8B:
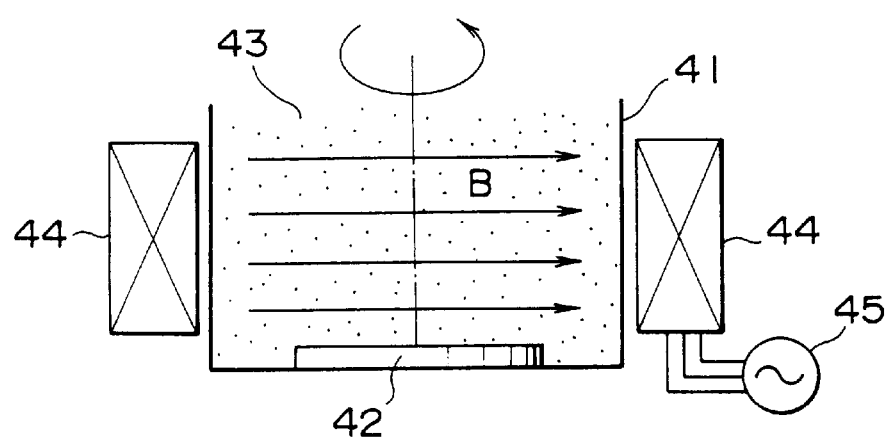

The apparatus for plasma control shown in FIGS. 8A and 8B is provided with a rotating magnetic field generating means comprising a coil 44 wound around the object 42 and a multi-phase AC power supply 45 for feeding a multi-phase (for example three-phase) AC current to the coil 44, and by feeding a multi-phase AC current to the coil 44, the pseudo magnetic field with a magnetic flux density B generated in the direction parallel to the surface of the object 42 is rotated.

For example, by selecting a frequency in a range from several 10 Hz to several kHz for the three-phase AC current, the magnetic field generated on the object 42 rotates around an axis perpendicular to the surface of the object 42 with a rpm depending on the frequency of the AC current.

With the rotation of the magnetic field, a band induced electric field is generated surrounding the magnetic field, then the band induced electric field E also rotates.

On the surface of the object 42, the parallel electric field $E_H$ rotates (refer to FIG. 4B), thus in the apparatus for plasma control the composite electrode Ec composed of the electric field $E_H$ and the perpendicular electric field Ev by the high frequency bias 23 as shown in FIG. 2 can control the moving direction of ion or electron in plasma atmosphere.

Figure 9A:
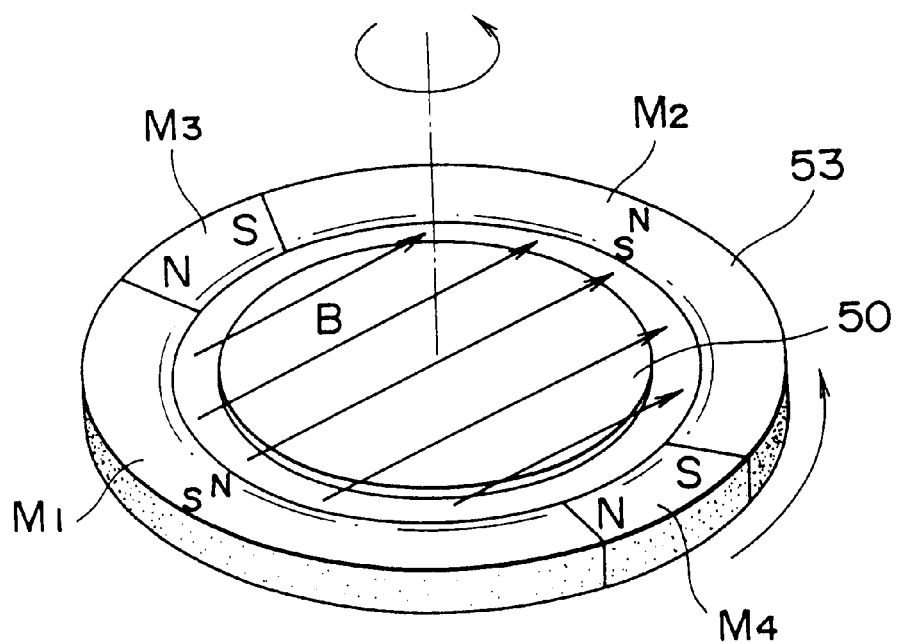
FIGS. 9A and 9B show the fourth embodiment in accordance with the present invention, and are diagrams for illustrating an apparatus for plasma control utilizing rotating magnetic field.
Figure 9B:
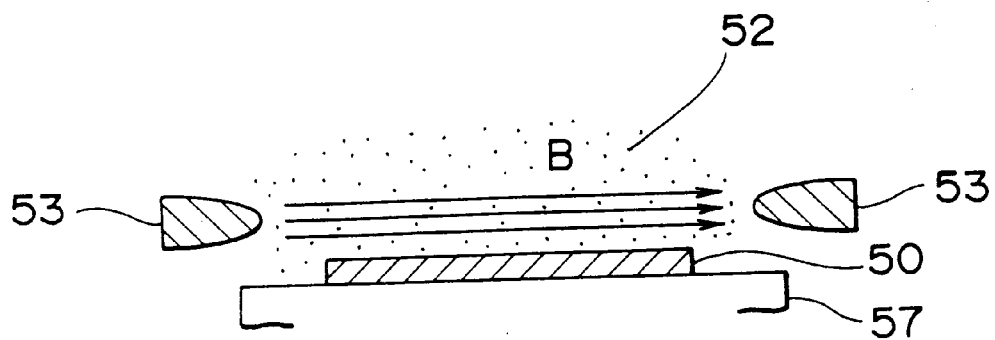

An apparatus for plasma control shown in FIGS. 9A and 9B is provided with a rotating magnetic field generating means comprising a permanent magnet ring 53 provided around the object 50 for generating a magnetic field with a magnetic flux density B in the direction parallel to the surface of the object 50 and a rotating mechanism (not shown in the figure) for rotating the permanent magnet 53 around the object 50.

The permanent magnet ring 53 is constituted with four linked magnet sections of, for example, $M_1$, $M_2$, $M_3$, and $M_4$, and the cross-sectional shape of the magnet is streamlined so as not to disturb gas flow when the magnet is rotated.

In this apparatus for plasma control, by rotating the permanent magnet ring 53 at, for example, several thousands rpm to several ten thousand rpm, the magnetic field from N-pole to S-pole is rotated around an axis perpendicular to the surface of the object.

The rotation of the magnetic field causes the generation of a band induced electric field E (refer to FIG. 4B) surrounding the magnetic field, and the band electric field E also rotates.

The rotation of the induced electric field E induces the rotation of the parallel electric field $E_H$ on the surface of the object 50.

The apparatus for plasma control can control the moving direction of ion or electron in plasma atmosphere with a composite electric field Ec composed of the electric field $E_H$ and the perpendicular electric field Ev by the high frequency bias 23 as shown in FIG. 2.

Figure 10A:
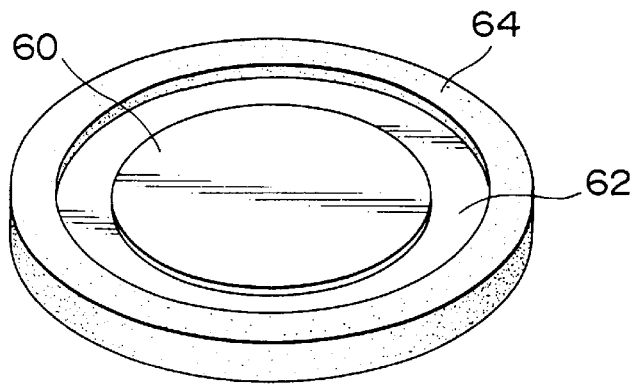
FIGS. 10A to 10C show the fifth embodiment in accordance with the present invention which is provided with a magnetic ring.
Figure 10B:
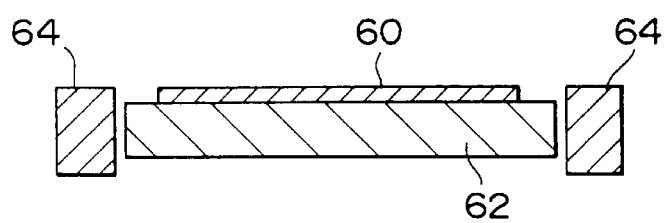
Figure 10C:
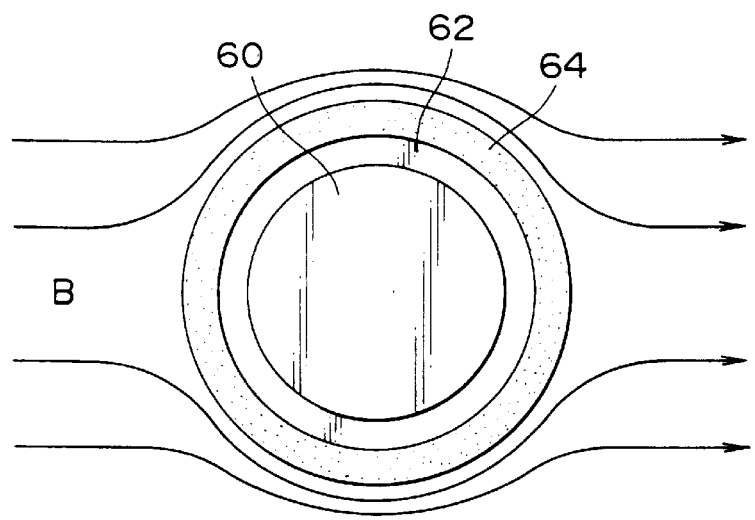

FIGS. 10A to 10C are schematic diagrams for illustrating an example of an apparatus for plasma control of the fifth embodiment in accordance with the present invention provided with the magnetic ring, in which FIG. 10A is a perspective view, FIG. 10B is a sectional view, and FIG. 10C is a view for illustrating the line of magnetic flux.

As shown in FIGS. 10A and 10B, the apparatus for plasma control is provided with a magnetic ring 64 around the bottom electrode 62 on which the object 60 is to be placed and the object 60 to prevent magnetic flux from passing through the object 60 such as wafer and prevent the electronic circuit from being damaged.

As shown in FIG. 10C, the magnetic field with a magnetic flux density B in the direction parallel to the surface of the object 60 passes so as to get out the way of the bottom electrode 62 and the object 60 because of the existence of the magnetic ring 64, and the magnetic flux does not affect on the internal of the object 60.

Thereby, a needless current in the object 60 is suppressed and the formed electronic circuit is prevented from damaging.

The apparatus for plasma control shown in FIGS. 7 to 10C may be, for example, a plasma CVD apparatus, plasma RIE apparatus, spattering apparatus, or ion plating apparatus.

The apparatus for plasma control may be a flattening apparatus for flattening treatment of the object or polishing apparatus for polishing treatment of the object.

An apparatus for plasma control of the present invention used as various processing apparatus is provided with an adjusting means (not shown in figures) for adjusting strength ratio and frequency ratio of the electric field Ev in the direction perpendicular to the surface of the object to the electric field $E_H$ in the parallel direction, and by using the adjusting means (not shown in figures), the direction of composite electric field Ec (refer to FIG. 2) composed of the electric field Ev (refer to FIG. 2) and the electric field $E_H$ is controlled to control the processing direction to the object.

FIGS. 11A to 13B are cross-sectional views for illustrating processing examples using the method for plasma control and the apparatus for plasma control of the sixth, seventh, and eighth embodiments in accordance with the present invention.

FIG. 11 is a sectional view for illustrating a processing example of a trench.

Figure 11A:
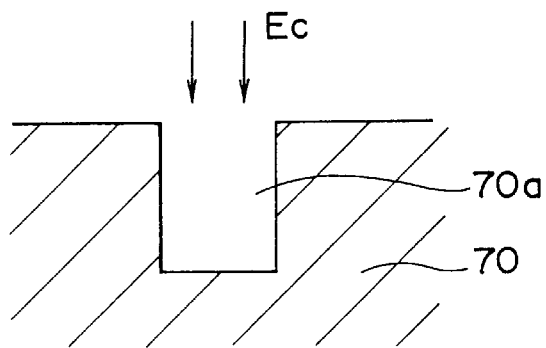
FIGS. 11A to 11C are cross sectional views for illustrating the processing on a trench of the sixth embodiment in accordance with the present invention.

For example, when a trench 70a is to be formed in the direction perpendicular to the surface of the object 70 as shown in FIG. 11A using a plasma RIE apparatus applied with the present invention, a composite electric field Ec is generated in the direction perpendicular to the surface of the object 70 (for example, the electric field Ev is 100% and the electric field $E_H$ is 0% in FIG. 2) to control the direction of ion or electron, and thus a trench 70a perpendicular to the surface of the object 70 is formed.

Figure 11B:
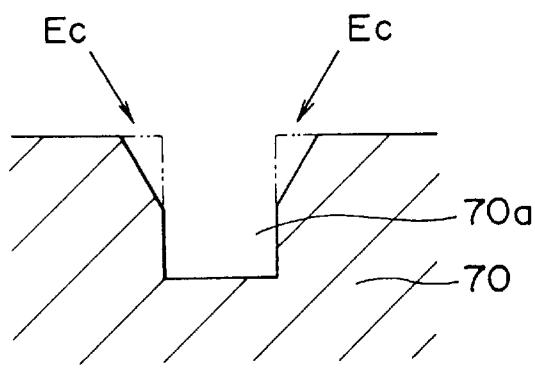

When tapers are to be formed at the opening of the trench 70a, a composite electric field Ec is generated in the direction depending on an taper angle as shown in FIG. 11B (composite electric field Ec is generated by composing the electric field Ev and the electric field $E_H$, shown in FIG. 2, in a certain ratio depending on the taper angle to control the direction of ion or electron, and thus the opening is etched in a form of taper with a desired angle.

Figure 11C:
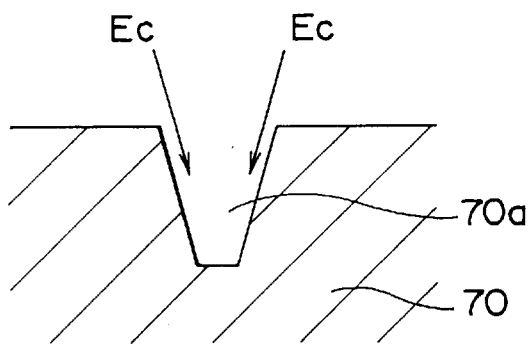

In a different way as shown in FIG. 11C, a composite electric field Ec is generated in the direction slant to the surface of the object 70 from the beginning, and a trench 70a with taper on both whole sides is formed.

According to the present invention, by using the adjusting means described hereinbefore, etching processing for forming various shapes is possible using the same apparatus.

Figure 12A:
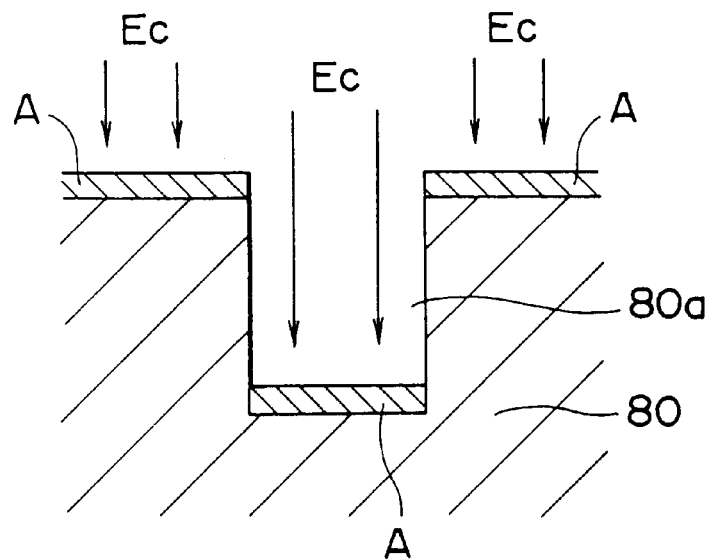
FIGS. 12A and 12B are sectional views for illustrating an example of film forming in the seventh embodiment in accordance with the present invention.
Figure 12B:
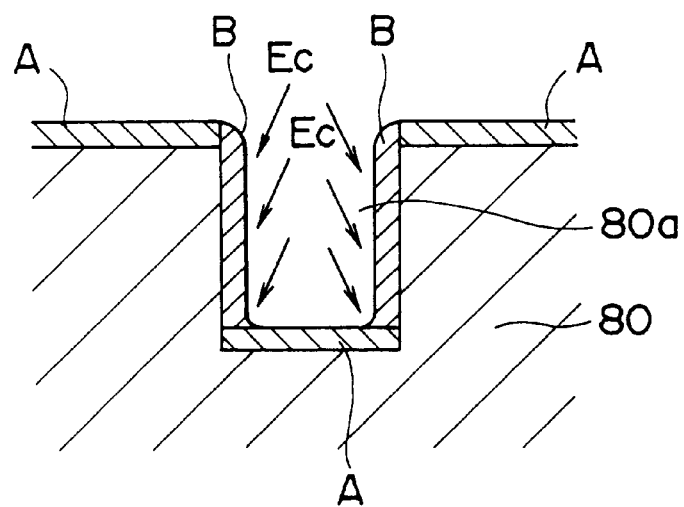

FIGS. 12A and 12B are sectional views for illustrating an example of deposit processing.

As shown in FIG. 12A, when a upside deposit A is to be formed on the top surface of the object 80, for example, a composite electric field Ec is generated in the direction perpendicular to the surface of the object 80 using a plasma CVD apparatus applied with the present invention.

Thereby, a surface deposit A is formed on the top surface of the object 80 and bottom surface of a trench 80a.

When a lateral deposit B is to be formed on the lateral sides of a trench 80a as shown in FIG. 12B, by adjusting ratio of the electric field Ev (refer to FIG. 2) to the electric field $E_H$ (refer to FIG. 2) using the adjusting means described hereinbefore, a composite electric field Ec is generated in the direction slant to the surface of the object, the slant composite electric field Ec allows ion or electron to act on the lateral sides of the trench 80a.

Thereby, a lateral deposit B is formed on the lateral sides of a trench 80a, thus the whole surface of the object 80, namely the top surface and all inside surfaces of a trench, is covered with deposit such as oxide film.

This method is a remarkably effective method especially for manufacturing trench capacitors accurately with high yield.

Examples of trench 80a processing are described herein above, but this invention by no means limited to the examples, and the invention is applied to the inside surface treatment of various types of hole such as via holes and contact holes.

FIGS. 13A and 13B are sectional views for illustrating flattening processing.

As shown in FIG. 13A, when an insulating layer 92 is formed on the object 90 on which wiring 91 of metal such as aluminum are provided previously usually the surface of the insulating layer 92 is waved because of the underlaid projections of metal wiring 91.

To flatten the surface, a composite electric field Ec is generated in the direction parallel to the surface of the object 90 using a flattening apparatus having the adjusting means described hereinbefore applied with the present invention.

The composite electric field Ec forces ion or electron in plasma atmosphere 27 (refer to FIG. 2) to move in the direction parallel to the surface of the object 90, and high spots on the surface of the insulating layer 93 are removed off, thus the flattening is possible as shown in FIG. 13B.

When the object 90 is to be polished, a composite electric field Ec is generated in the direction along the polishing plane to control the moving direction of ion or electron, thereby, the polishing is possible similarly to the flattening in which high spots are removed off.

By combining above described etching, depositing, and flattening which utilize plasma, other processing such as etch back are possible.

In detail, the three dimensional processing to the object 90 is possible by controlling ion or electron in plasma atmosphere (refer to FIG. 2) utilizing a composite electric field Ec composed of the electric field Ev (refer to FIG. 2) in the direction perpendicular to the surface of the object 90 and the electric field $E_H$ (refer to FIG. 2) in the parallel direction.

The frequency and strength of electric field in the embodiments described hereinbefore are only for example, and this invention by no means limited by the embodiments.

The processing examples described in the embodiments are also for only example, and the present invention can be applied to other processing to the object.

As described hereinbefore, the method for plasma control and the apparatus for plasma control in accordance with the present invention exhibit the following effects.

In the present invention, not only the electric field in the direction perpendicular to the surface of the object but also the electric field in the parallel direction are controlled in plasma atmosphere, therefore, the moving direction of ion or electron in plasma atmosphere can be controlled as desired by the composite electric field composed of both the electric fields.

The electric field in the direction parallel to the surface of the object is controlled based on reactance and conductivity of an electrode on which the object is to be placed, and the magnetic flux density near the surface of the object is controlled based on moving period of a magnetic field generated in the direction parallel to the surface of the object, thereby, an induced electric field generated in the direction parallel to the surface of the object is controlled in parallel and uniformly and is strengthened, thus the moving direction of ion or electron is controlled accurately.

In addition, the moving speed of ion or electron is controlled by adjusting gas pressure introduced for plasma generation.

By applying these techniques, processing of a trench (taper processing), processing on the inside surface of a trench, flattening of an object, and polishing of an object are possible.

The present invention provides an effective method and apparatus for minimization of semiconductor elements and structuring of three dimensional semiconductor elements.

What is claimed is;:

1. A method for plasma control for controlling the direction of ions or electrons in a plasma atmosphere generated in a processing chamber in which an object to be processed is placed, comprising the steps of:

generating an electric field in the direction perpendicular to the surface of said object, and generating another electric field in the direction parallel to said surface by rotating a magnetic field generated in the direction parallel to the said surface around an axis perpendicular to said surface and said parallel electric field is rotated, and controlling the direction of said ions or electrons by controlling the composite electric field composed of said electric fields in both the directions, wherein said electric field generated in the direction parallel to the surface of said object is controlled based on reactance and conductivity of said electrode on which said object is to be placed in said processing chamber.

2. A method for plasma control for controlling the direction of ion or electron in plasma atmosphere generated in a processing chamber in which an object to be processed is placed, wherein an electric field is generated in the direction perpendicular to the surface of said object and an electric field is generated in the direction parallel to said surface, and the moving direction of said ion or electron is controlled by controlling the composite electric field composed of said electric fields in both the directions, wherein said electric field generated in the direction parallel to the surface of said object is controlled based on reactance and conductivity of said electrode on which said object is to be placed in said processing chamber.

* * * * *